United States Patent
Zhou et al.

(10) Patent No.: US 8,779,405 B2
(45) Date of Patent: Jul. 15, 2014

(54) FIELD FOCUSING FEATURES IN A RERAM CELL

(75) Inventors: Feng Zhou, Austin, TX (US); Frank K. Baker, Jr., Austin, TX (US); Ko-Min Chang, Austin, TX (US); Cheong Min Hong, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/486,690

(22) Filed: Jun. 1, 2012

(65) Prior Publication Data

US 2013/0320285 A1    Dec. 5, 2013

(51) Int. Cl.
*H01L 29/02*  (2006.01)

(52) U.S. Cl.
USPC ............... 257/2; 438/104; 438/141; 438/382; 438/466; 257/4; 257/209; 257/E27.016

(58) Field of Classification Search
CPC . H01L 45/1625; H01L 45/148; H01L 45/145; H01L 29/513
USPC .......... 438/104, 141, 172, 382, 466; 257/2, 4, 257/43, 209, 529, E27.016, E27.051, 257/E29.33
See application file for complete search history.

(56) References Cited

U.S. PATENT DOCUMENTS

| | | | |
|---|---|---|---|
| 7,719,039 B2 | 5/2010 | Muralidhar et al. | |
| 7,928,503 B2 | 4/2011 | Hanafi | |
| 8,035,156 B2 | 10/2011 | Winstead et al. | |
| 2006/0006471 A1 | 1/2006 | Rossel et al. | |
| 2010/0083487 A1 | 4/2010 | Noshiro et al. | |
| 2010/0110759 A1* | 5/2010 | Jin et al. | 365/148 |
| 2010/0117053 A1* | 5/2010 | Sekar et al. | 257/4 |
| 2011/0227026 A1 | 9/2011 | Sekar et al. | |
| 2011/0240949 A1 | 10/2011 | Mitani et al. | |

OTHER PUBLICATIONS

Chang et al.; "Improvement of resistive switching characteristics in TiO2 thin films with embedded Pt nanocrystals"; Applied Physics Letters 95; 2009; 3 Pgs; American Institute of Physics.
Cheng et al.; "Long-Endurance Nanocrystal TiO2 Resistive Memory Using a TaON Buffer Layer"; IEEE Electron Device Letters; Dec. 2011; pp. 1749-1751; vol. 32, No. 12; IEEE.
Panda et al.; "Non-volatile Memristive Switching Characteristics of TiO2 Film Embedded With Nickel Nanocrystals"; IEEE Transactions on Nanotechnology; Jan. 2012; pp. 51-55; vol. 11, No. 1; IEEE.
U.S. Appl. No. 13/085,208, filed Apr. 12, 2011.
U.S. Appl. No. 13/085,217, filed Apr. 12, 2011.
Office Action mailed Nov. 1, 2013 in U.S. Appl. No. 13/486,641.
Office Action mailed Feb. 12, 2013 in U.S. Appl. No. 13/486,641.

* cited by examiner

*Primary Examiner* — Mark A Laurenzi
(74) *Attorney, Agent, or Firm* — David G. Dolezal; Joanna G. Chiu

(57) ABSTRACT

A resistive random access memory (ReRAM) cell comprising a first conductive electrode and a dielectric storage material layer over the first conductive electrode. The dielectric storage material layer is conducive to the formation of conductive filaments during the application of a filament forming voltage to the cell. The cell includes a second conductive electrode over the dielectric storage material layer and a layer of conductive nanoclusters (911, 1211) including a plurality of nanoclusters in contact with the dielectric storage material layer and in contact with the first conductive electrode or the second conductive electrode.

20 Claims, 9 Drawing Sheets

FIELD FOCUSING FEATURES IN A RERAM CELL

RELATED APPLICATION

This application is related to an application entitled "Field Focusing Features in a ReRAM Cell" being filed concurrently with this application, having the same inventors, having a common assignee, and having Ser. No. 13/486,641, all of which is incorporated by reference in its entirety.

BACKGROUND OF THE INVENTION

1. Field of the Invention

This invention relates in general to ReRAM cells and more particularly to field focusing features in ReRAM cells.

2. Description of the Related Art

A resistive random access memory (ReRAM) cell is a memory cell in which conductive filaments (paths) are formed through a dielectric storage material by the application of a sufficiently high voltage across the electrodes of the cell to place the cell in a low resistivity state. In a low resistivity state, the filaments may be broken by the application of a high current through the dielectric material to place the cell in a high resistivity state. The difference in resistivity states can be used to store a value in the ReRAM cell.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

A ReRAM memory cell includes a region of interspersed field focusing features that allow for the generation of a limited and a more consistent number of current filaments through a dielectric storage material layer between electrodes of a ReRAM cell. These field focusing features allow for a more organized and consistent arrangement of the filaments in the cells of an array thereby leading to more consistent resistive measurements among similarly programmed ReRAM cells. In some embodiments, these features include nanoclusters or features formed from nanoclusters.

Figure 1:
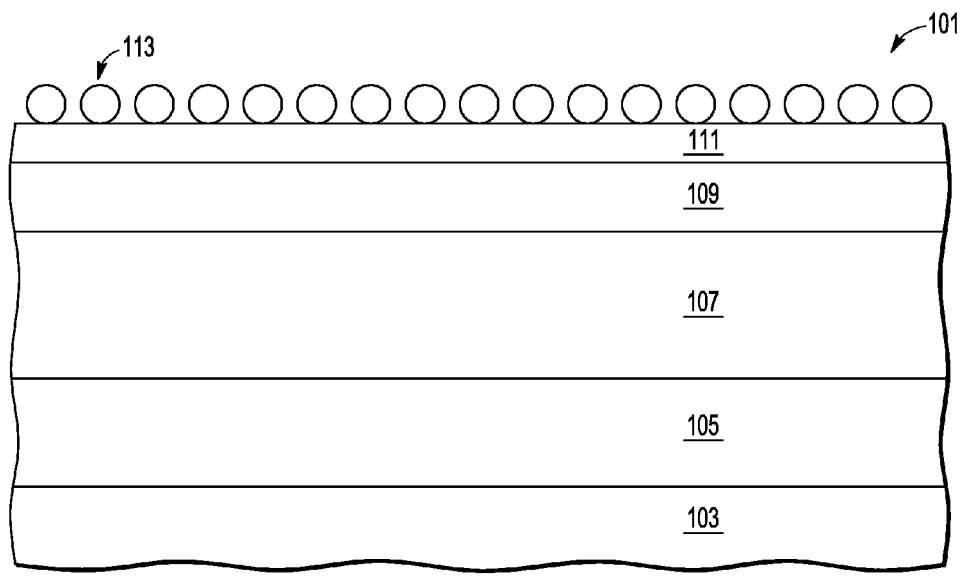
FIGS. 1-5 set forth various views of forming a portion of a ReRAM memory according to one embodiment of the present invention.

FIG. 1 shows a partial cross sectional side view of a wafer 101 used to form a plurality of ReRAM cells according to one embodiment of the present invention. Wafer 101 includes a substrate 103 and a dielectric layer 105 formed over substrate 103. In one embodiment, substrate 103 is a composite structure that includes multiple layers and structures. For example, substrate 103 may include a bulk silicon base layer and multiple transistors formed thereon. These transistors may include electrode structures (e.g. gates, current terminal electrodes) formed of conductive materials. Substrate 103 may also include dielectric structures (e.g. sidewall spacers, trench isolations regions) that separate the conductive and semiconductor structures of the substrate. However in other embodiments, substrate 103 may have other configurations such as being made of a bulk material.

Layer 105 is a dielectric layer formed over substrate 103 to isolate the subsequently formed ReRAM cells from substrate 103. In one embodiment, layer 105 is formed from a dielectric material (e.g. tetraethyl orthosilicate (TEOS), $SiO_2$). In one embodiment, layer 105 is an interlayer dielectric of an interconnect portion of a wafer. The interconnect portion includes conductive interconnects (not shown) that electrically couple transistors and other devices of wafer 101 to subsequently formed external conductors (e.g. bond pads) and the subsequently formed ReRAM cells. Interconnecting conductive structures (e.g. vias, conductive plugs) may be located in other parts of layer 105 (not shown). In one embodiment, substrate 103 may include one or more conductive interconnect layers.

A conductive layer 107 is formed on layer 105. Conductive layer 107 includes material from which the bottom electrodes of subsequently formed ReRAM cells will be formed. Layer 107 may be made of copper, tungsten, or other conductive material (e.g. aluminum, gold, platinum, doped poly silicon), or combinations thereof. In some embodiments, layer 107 may include multiple layers of conductive material. In one embodiment, layer 107 has a thickness of 1000 Angstroms, but may have other thicknesses in other embodiments.

Layer 109 is a layer of dielectric storage material in which conductive filaments may be formed for storing a value in a ReRAM cell. In one embodiment, dielectric storage material may be a metal oxide such as hafnium oxide, nickel oxide, copper oxide, and cobalt oxide. However, other suitable materials conducive to conductive filament formation may be used. In one embodiment, layer 109 has a thickness of 500 Angstroms, but may have other thicknesses in other embodiments. Layer 109 may be formed in a number of ways (e.g. deposition by CVD, PECVD, or atomic layer deposition, oxidation of a metal, or sputtering).

A dielectric layer 111 is formed on layer 109. Layer 111 can be of a dielectric storage material or a different dielectric material. Layer 111 is of a material that can be etched with etch chemistries that are selective to the material of layer 109. In one embodiment, layer 111 is made of silicon oxide or a metal oxide with a different etch rate than that of dielectric layer 109 for the selected etch chemistry. In one embodiment, layer 111 is 200 A thick, but may have other thicknesses in other embodiments.

After the formation of layer 111, nanoclusters 113 are formed on layer 111. A nanocluster is an island of material that is formed on a surface and that has dimensions that are 100 nanometers or less (e.g. 20 nanometers or less) as formed and does not have to be lithographically defined. Examples of nanoclusters are silicon nanocrystals, germanium nanocrystals, dielectric nanoclusters, metal nanoclusters (gold, platinum, nickel, cobalt), and silicided nanoclusters. These nanoclusters can be formed by a CVD process where individual clusters nucleate and grow on a surface. In one example, metal nanoclusters may be formed by sputtering a relatively thin layer (e.g. 20 nm) of metal followed by an anneal process where the metal is agglomerated to the individual nanoclusters. In one embodiment, the nanoclusters have a height and width of 20 nanometers, but may be of other dimensions in other embodiments.

Figure 5:
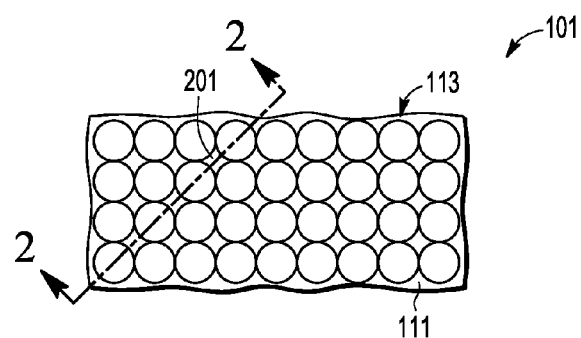

Referring to FIG. 5, in one embodiment, the nanoclusters 113 are formed such that material of each nanocluster touches some of the adjacent nanoclusters but yet openings (201) are included between other adjacent nanoclusters. A partial top view of wafer 101 is shown in the top of view of FIG. 5. As shown in the view of FIG. 5, the nanoclusters 113 define several openings that expose layer 111. In the embodiment of FIG. 5, nanoclusters 113 are shown as having a circular shape, however, nanoclusters of other embodiments may have other shapes. In one embodiment, the nanoclusters have a coverage density of 75%, but may have other densities in other embodiments.

Figure 2:
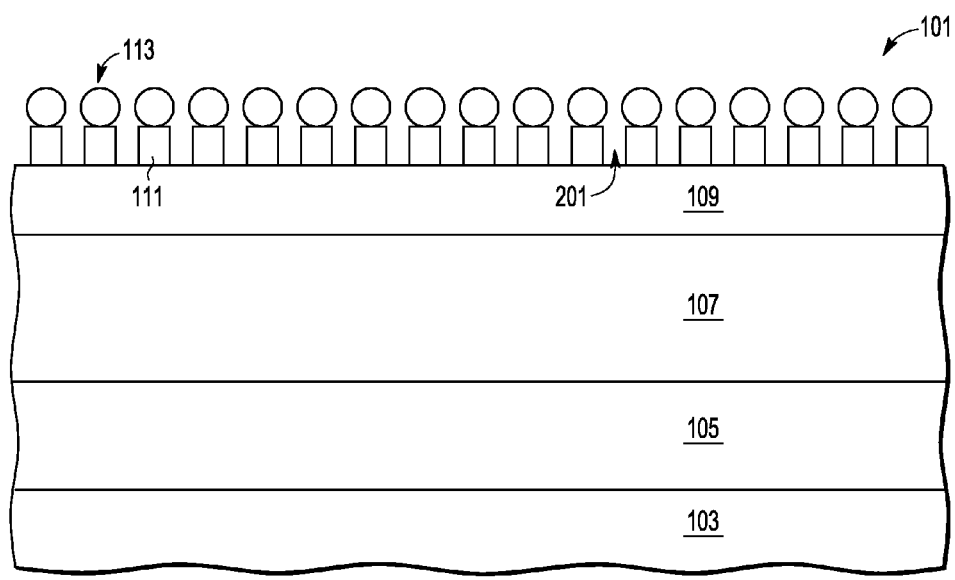

FIG. 2 is a partial cross sectional side view of wafer 101 after layer 111 has been patterned using nanoclusters 113 as a mask. Patterning layer 111 forms a number of openings 201 interspaced in layer 111. In one embodiment, openings 201 have a width of 10 nanometers or less, but may be of other widths in other embodiments. In one embodiment where layer 111 is made of silicon dioxide, nanoclusters 113 are made of silicon, and layer 109 is made of hafnium oxide, an etch chemistry of $SF_6$ or $NF_3$ can be used to pattern layer 111.

Figure 3:
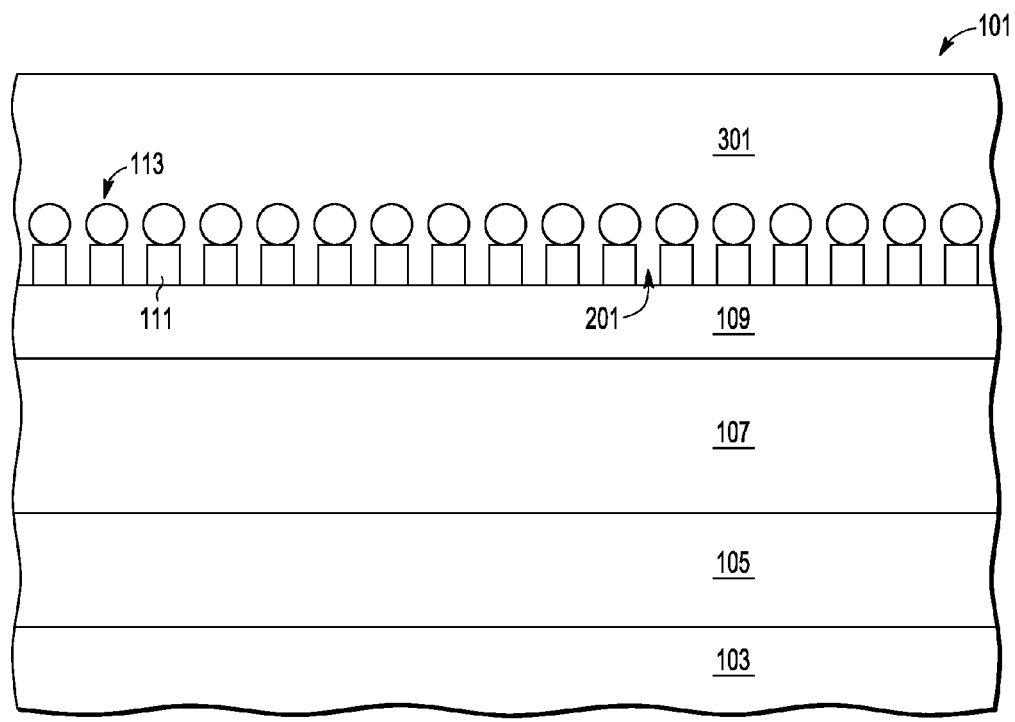

FIG. 3 shows a partial cutaway side view of wafer 101 after a conductive layer 301 is formed over nanoclusters 113 and in openings 201. In one embodiment, layer 301 is formed (e.g. by sputtering, ALD, CVD) of a conductive material such as copper, tungsten, gold, cobalt, platinum, aluminum, or doped polysilicon or combinations thereof that will be used to form a top electrode for a ReRAM cell. In one embodiment, layer 301 has a thickness of a 1000 Angstroms, but may have other thicknesses in other embodiments.

In the embodiment shown, nanoclusters 113 are not removed prior to forming layer 301. However in other embodiments, nanoclusters 113 are removed prior to forming layer 301.

Figure 4:
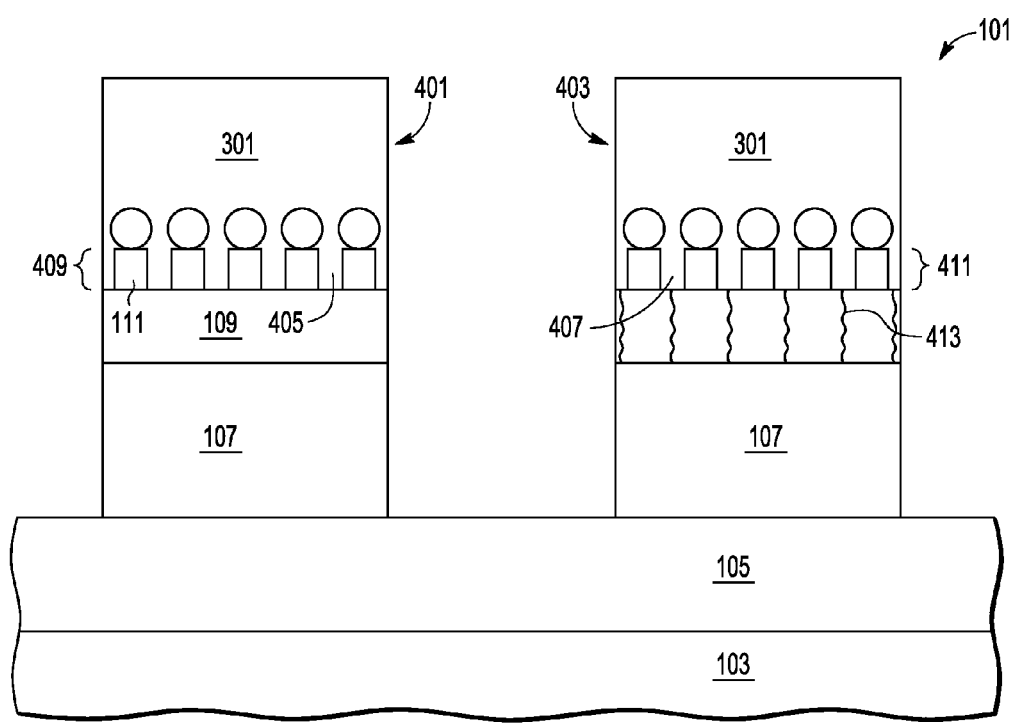

FIG. 4 shows a partial cutaway side view after layers 301, 111, 109 and 107 are patterned to form individual ReRAM cells with cells 401 and 403 being shown in FIG. 4. In one embodiment these layers are patterned using a photolithographic process where a mask is formed over layer 301 and used to pattern the layers. In one embodiment, layer 107 is patterned with a separate pattern in order to form electrically conductive structures (not shown) for coupling the cells to other circuitry (not shown) of the ReRAM memory (e.g. read, write, and program circuitry). In one embodiment, the cells are located in rows and columns in an array of ReRAM cells. In one embodiment, cells 401 and 403 have a width of 200 nm, but may have other widths in other embodiments.

After the view of FIG. 4, a dielectric layer is formed over wafer 101. In one embodiment, the wafer is then planarized to stop on layer 301. In another embodiment, an opening may be made in the subsequently deposited dielectric layer to expose layer 301. Subsequent interconnect layers may be formed on wafer 101. These subsequent layers include interconnect structures coupled to the top electrode (the structures of layer 301 of the cells) to connect the cells to other circuitry of the memory. After forming the conductive external terminals, the wafer is singulated into multiple die. Each die includes an array of ReRAM cells. Each die may also include other circuitry of the memory as well as circuitry of other devices (e.g. processors, logic, clocking circuitry).

Referring back to FIG. 4, cells 401 and 403 each include a region 409 and 411, respectively, of interspersed field focusing features (405 and 407, respectively). In the embodiment, the field focusing features are the portions of layer 301 formed in the openings 201 of layer 111. During a "forming" process, these features create enhanced electric fields that promote the formation of conductive filaments 413 at these locations through layer 109 to the bottom electrode. Thus, the filaments tend to form at specific areas of the film defined by the features. Note that the lines illustrate the general locations of the filaments that are formed when the cell is programmed. Those filaments are not present until the first time that a forming voltage is applied to the electrodes.

In some embodiments, the filaments are formed during a forming process where a high filament forming voltage (e.g. above 3V) is applied across the electrodes. In subsequent writes to the cell, a lower voltage (e.g. of approximately 1-2 V) may be used to change the resistivity state of a cell to store a particular value. For example, a write voltage is applied across the electrodes to break the filament paths at particular locations to change the cell to a high resistivity state from a low resistivity state. A write voltage may be applied across the electrodes to reconnect the broken filaments to switch the cell from the high resistivity state to the low resistivity state. However, filaments may be formed by different processes and/or the cell may be written to by different processes in different embodiments. For example, in some embodiments, the filaments are formed by the first write to the cell. Thus, for these embodiments, a filament forming voltage would be the voltage across the electrodes for the first write to the cell. A voltage applied "across the electrodes" of a cell is the difference in the voltages applied to each electrode of the cell.

With conventional ReRAM cells having no field enhancing features, the location and number filaments is less controlled. Different cells of an array may have a widely varying number of filaments for each cell and/or have filaments of varying shapes. Accordingly, with conventional ReRAM cells, the resistive values of a particular resistivity state may be significantly different for different cells of an array.

Providing field enhancement features that promote the generation of a controlled number of filaments and/or a more controlled shape of the filaments may lead to more consistent and tight resistive values of cells of an array.

Furthermore, by having multiple field enhancing structures per cell as opposed to one field enhancing structure, a controlled number of filaments may be created in a cell by the forming process. Each of the multiple filaments of a cell contributes to an average resistance of the cell in a low resistivity state. Although some of the filaments of a cell may vary in resistance with respect to other filaments of a cell, the overall resistive average of the cell would reflect the average resistance of the filaments. In some ReRAMs that are designed for the promotion of only one filament, the variation of filaments may lead to a variation of resistances among the cells. Hence, by providing multiple field enhancing features of a cell, the variation of the filaments generated in the cell would be "averaged out," thereby making cell resistances more uniform among the cells. For example, in some embodiments, 1/(the overall resistance of a cell) approximately equals the sum of 1/(the resistances of each filament of the cell).

Figure 6:
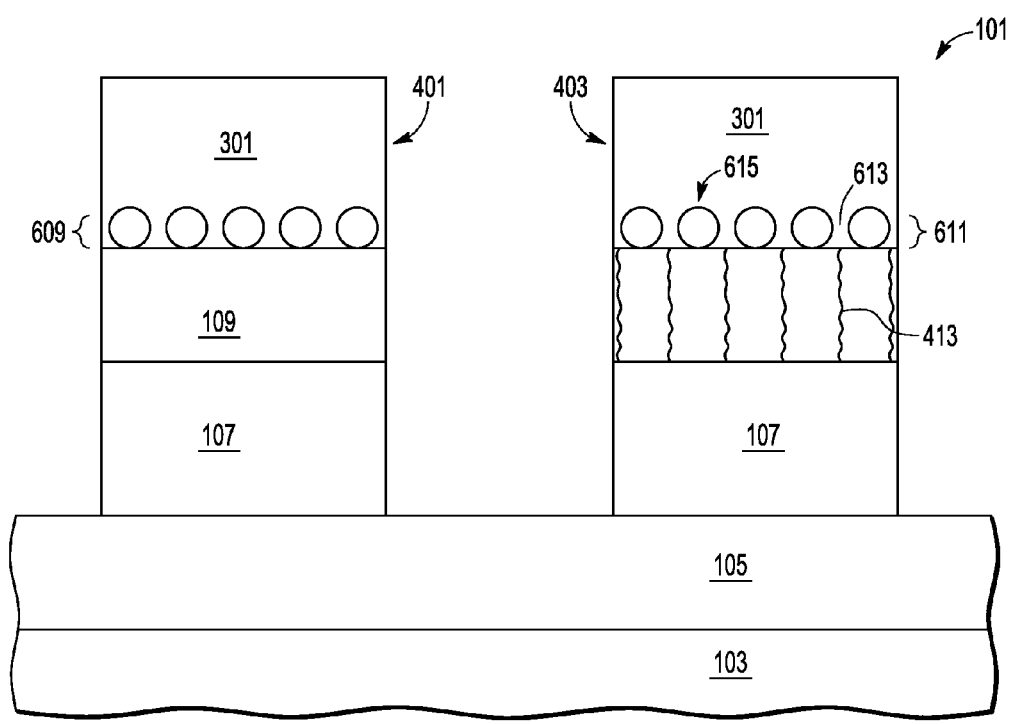
FIG. 6 sets forth a view of forming a portion of a ReRAM memory according to another embodiment of the present invention.

FIG. 6 shows a partial cutaway side view of a wafer according to another embodiment of the invention. The structures in FIG. 6 having the same reference numbers as the structures of FIG. 4 are similar to those corresponding structures. The embodiment of FIG. 6 differs from the embodiment of FIG. 4 in that nanoclusters 615 are formed on storage material layer 109. Also, the nanoclusters 615 are of a dielectric material whereas nanoclusters 113 of FIG. 4 may be of a conductive, semiconductive, or dielectric material. The field enhancing features 613 are the portions of layer 301 that are formed between the dielectric nanoclusters 615. These features 613 are located in regions 609 and 611. With this embodiment, there is no equivalent dielectric layer 111 located above layer 109. With this embodiment, nanoclusters 615 are not used to pattern a layer.

Dielectric nanoclusters are formed from a dielectric material such as silicon nitride, silicon dioxide, cerium oxide, or silicon oxynitride. In one embodiment, the nanoclusters may be formed by first forming silicon nanocrystals and oxidizing or nitriding the nanocrystals. Cerium oxide nanocrystals may be form by a hydrothermal synthesis process.

Figure 7:
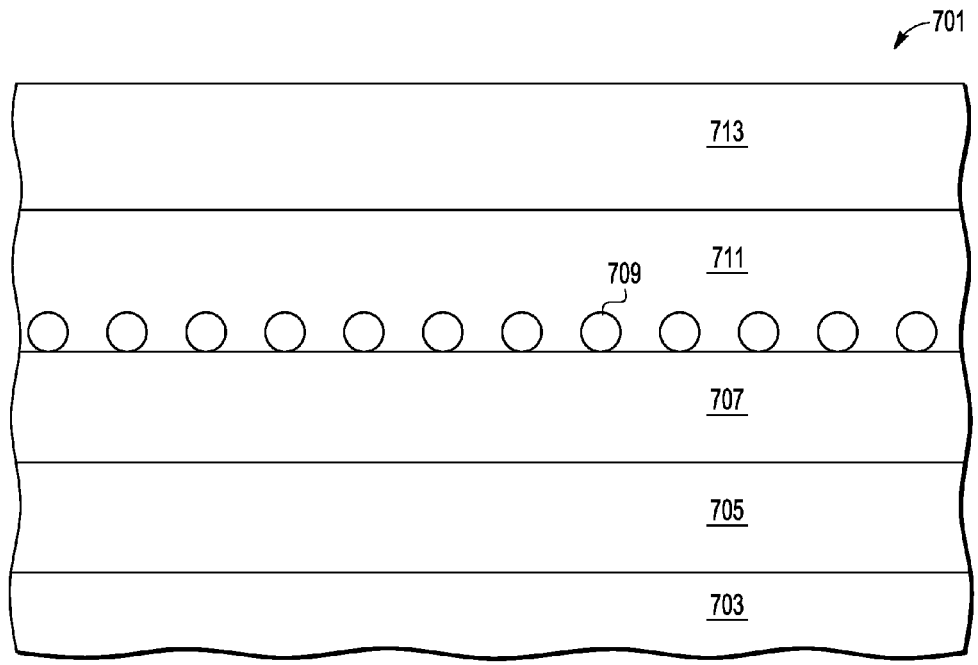
FIGS. 7-8 set forth various views of forming a portion of a ReRAM memory according to another embodiment of the present invention.
Figure 8:
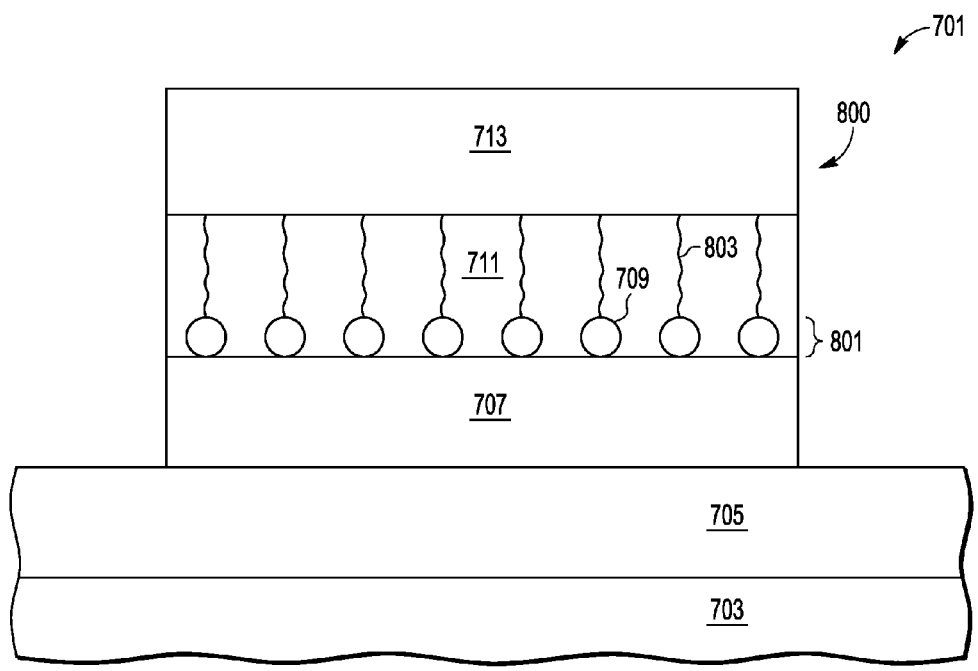

FIGS. 7 and 8 are partial cross sectional views of wafer 701 at different stages in the formation of another embodiment of a ReRAM cell. Substrate 703 and layers 705 and 707 are similar to substrate 103 and layers 105 and 107 respectively. In the embodiment of FIGS. 7 and 8, conductive nanocrystals 709 are formed on and in electrical contact with conductive layer 707. In one embodiment, conductive nanoclusters 709 have an average width and height of 20 nanometers, but may have other widths and heights in other embodiments (e.g. an average width of 50 nanometers or less).

Figure 16:
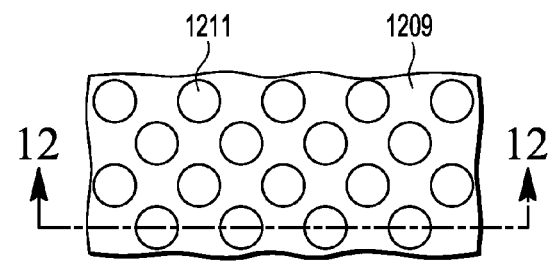

In one embodiment, nanoclusters 709 are spaced apart such that they do not touch an adjacent nanocluster. See for example, FIG. 16 showing a partial top view of a wafer where nanoclusters 1211 are spaced apart such that they do not touch adjacent nanoclusters. In one embodiment, nanoclusters 709 are spaced apart by 20 nanometers from other adjacent nanoclusters, but may be spaced apart by different amounts in other embodiments. In one embodiment, nanoclusters 709 have a coverage density of 40%, but may have other densities in other embodiments.

Referring back to FIG. 7, after the formation of nanoclusters 709, a layer 711 of dielectric storage material similar to layer 109 is formed over layer 707 and nanoclusters 709. Layer 711 is similar to layer 109. A conductive layer 713 (similar to layer 301) is formed over layer 711.

FIG. 8 shows wafer 701 after layers 713, layer 711, and layer 707 have been patterned to form ReRAM cells with cell 800 being shown in FIG. 8. With cell 800, the portion of layer 713 forms the top electrode, the portion of layer 711 forms the storage material, and the portion of layer 707 forms the bottom electrode. In the embodiment of FIG. 8, conductive nanoclusters 709 in region 801 act as the field enhancing features of cell 800. By applying a "forming" voltage across layers 707 and 713, an enhanced electrical field is formed around nanoclusters 709 to generate filaments 803 through layer 711 to the top electrode.

In another embodiment, the nanoclusters may be formed of a dielectric material that is not conducive to filament formation. The subsequently formed storage material is formed in the openings between the dielectric material. The dielectric nanoclusters would be formed to touch each other but would have openings there between (see FIG. 5). The field focusing features are portions of the bottom electrode where it contacts the storage material of layer 711 located in the openings defined by the nanoclusters.

Figure 9:
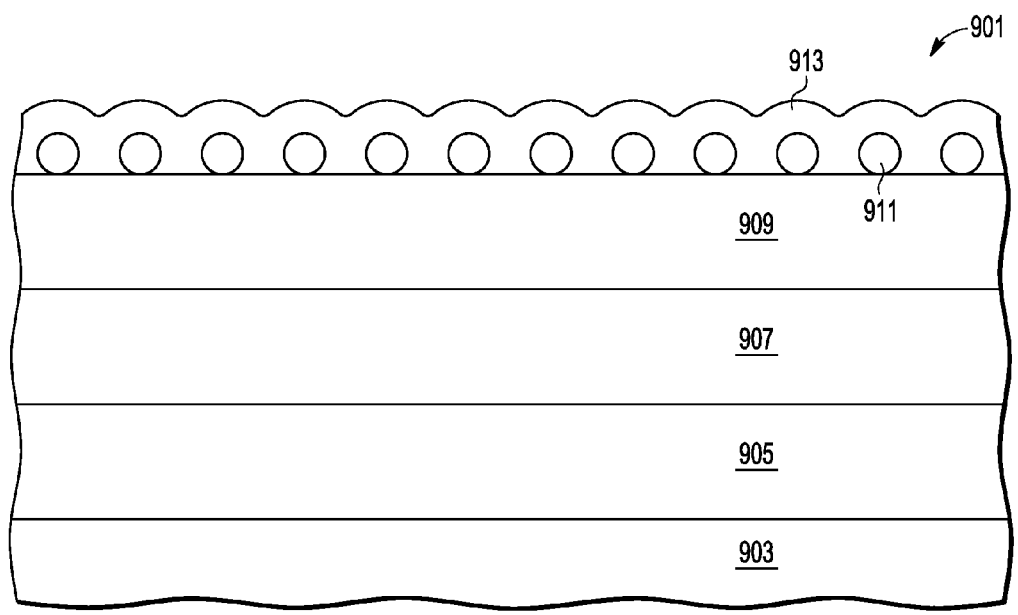
FIGS. 9-11 set forth various views of forming a portion of a ReRAM memory according to another embodiment of the present invention.
Figure 10:
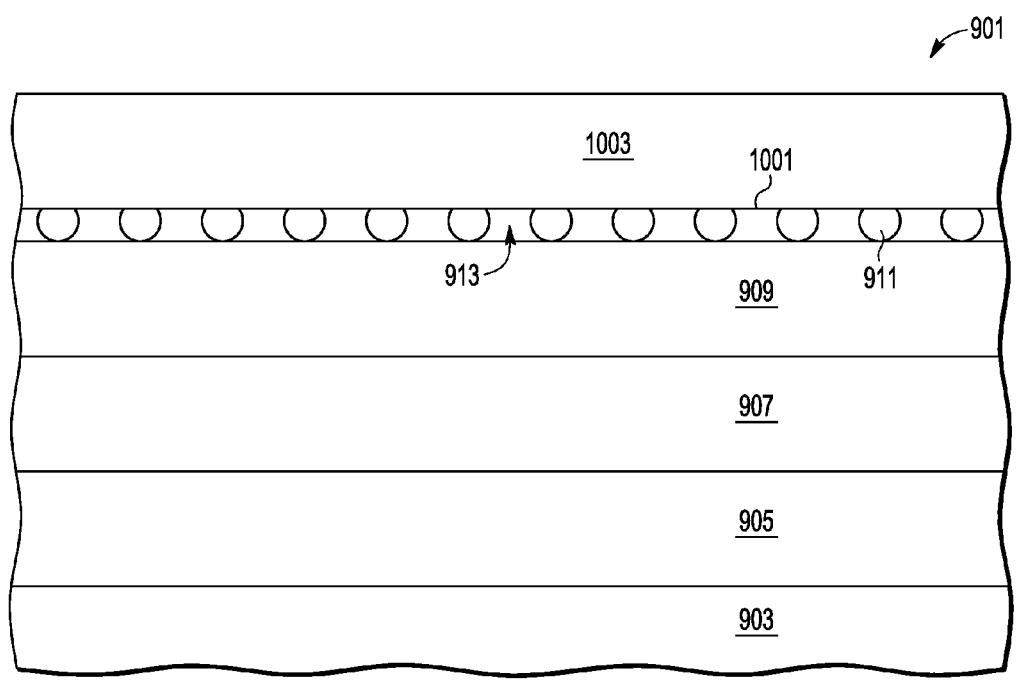
Figure 11:
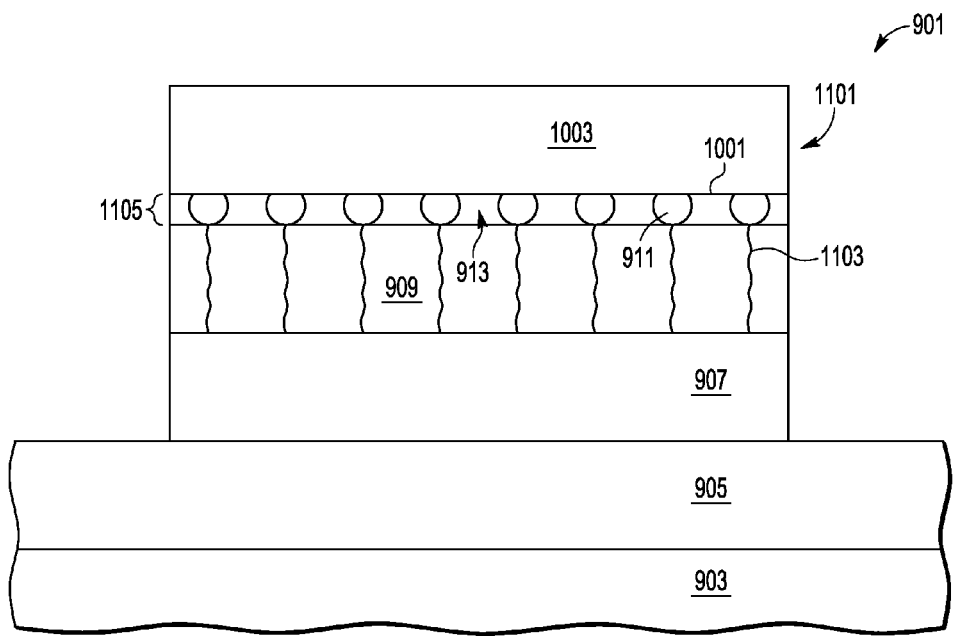

FIGS. 9-11 set forth partial cutaway side views of wafer 901 in the formation of a ReRAM cell according to another embodiment. Referring to FIG. 9, substrate 903 and layers 905, 907, and 909 are similar to substrate 103 and layers 105, 107, and 109 respectively. Conductive nanoclusters 911 are formed on layer 909. In one embodiment, nanoclusters are spaced apart from each other such that they do not contact adjacent nanoclusters. In one embodiment, nanoclusters 911 have a spacing of about 20 nanometers from each other, but maybe of other spacings in other embodiments.

A layer of dielectric material (e.g. silicon nitride, silicon oxide) is formed over the nanoclusters such that the lowest top portion of layer 913 is higher than the top of nanoclusters 911. Layer 913 may be of the same material as layer 909, but may be of other dielectric materials in other embodiments. In one embodiment, layer 913 is formed by a chemical vapor deposition (CVD) process, but may be formed by other processes in other embodiments.

FIG. 10 shows wafer 901 after wafer 901 has been planarized (e.g. with a CMP process) to form planarized surface 1001 to expose portions of nanoclusters 911. In one embodiment, the wafer 901 is planarized to the detection of the material of nanoclusters 911 and then for a short time afterwards to ensure that a significant portion of the surfaces of nanoclusters 911 are exposed. Afterwards a conductive layer 1003 is formed over planarized surface 1001 and electrically contacts nanoclusters 911. Layer 1003 is similar to layer 301.

FIG. 11 shows wafer 901 after layers 907, 909, 913, and 1003 are patterned to form cell 1101. In the embodiment shown, the conductive nanoclusters 911 located in region 1105 act as the field enhancing features for cell 1101. With the application of a filament forming voltage, nanoclusters 911 create enhanced electric fields that promote the formation of filaments 1103 at specific locations.

Figure 12:
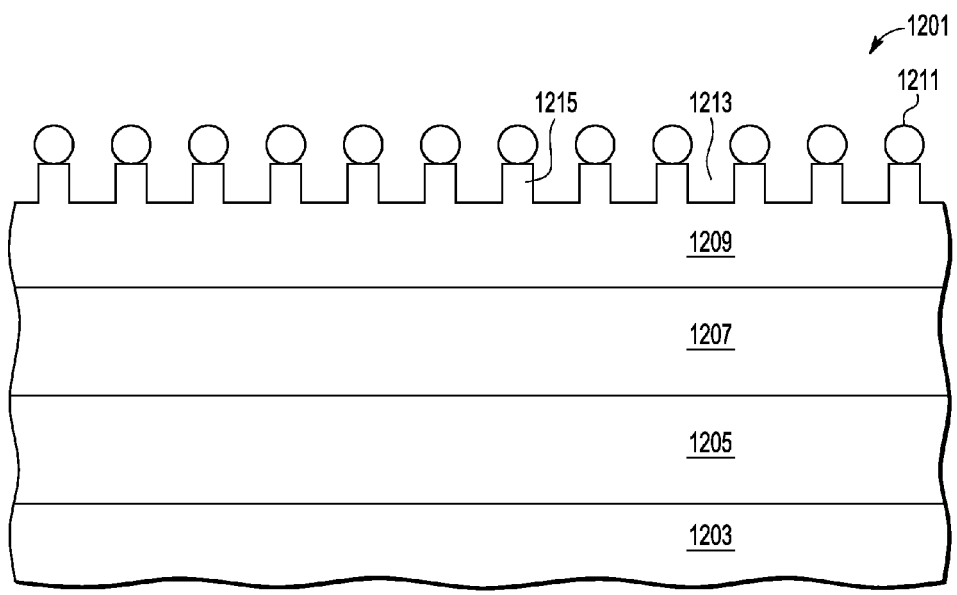
FIGS. 12-16 set forth various views of forming a portion of a ReRAM memory according to another embodiment of the present invention.

FIGS. 12-16 show various views of wafer 1201 in the formation of a ReRAM cell according to another embodiment of the present invention. In the embodiment of FIG. 12, substrate 1203 and dielectric layer 1205, conductive layer 1207, and storage material layer 1209 are similar to substrate 103, dielectric layer 105, conductive layer 107, and dielectric storage material layer 109 respectively. However, in the embodiment of FIG. 12, layer 1209 may be formed to be thicker than layer 109 due to its top portion being subsequently patterned. After the formation of storage material layer 1209, conductive nanoclusters are formed on layer 1209. In one embodiment, nanoclusters have an average width of 20 nanometers and are spaced apart from other adjacent nanoclusters by 20 nanometers, but may be of other average widths and of other spacings in other embodiments. FIG. 16 is a top view of wafer 1201 showing the spacings of nanoclusters 1211. In one embodiment, nanoclusters 1211 have a cover density in the range of 30-50% (e.g. 40%), but may have other densities in other embodiments.

After the formation of nanoclusters 1211, storage material layer 1209 is etched using nanoclusters 1211 as an etch mask to form openings 1213. In one embodiment, layer 1209 is etched using a timed etch with an etch chemistry that is selective to the nanocluster material. In one embodiment, openings 1213 have a depth of 20 nanometers, but may be of other depths in other embodiments. In the embodiment of FIG. 12, layer 1209 may be formed to be thicker than layer 109 of the embodiment of FIG. 4 by the depth of openings 1213.

Figure 13:
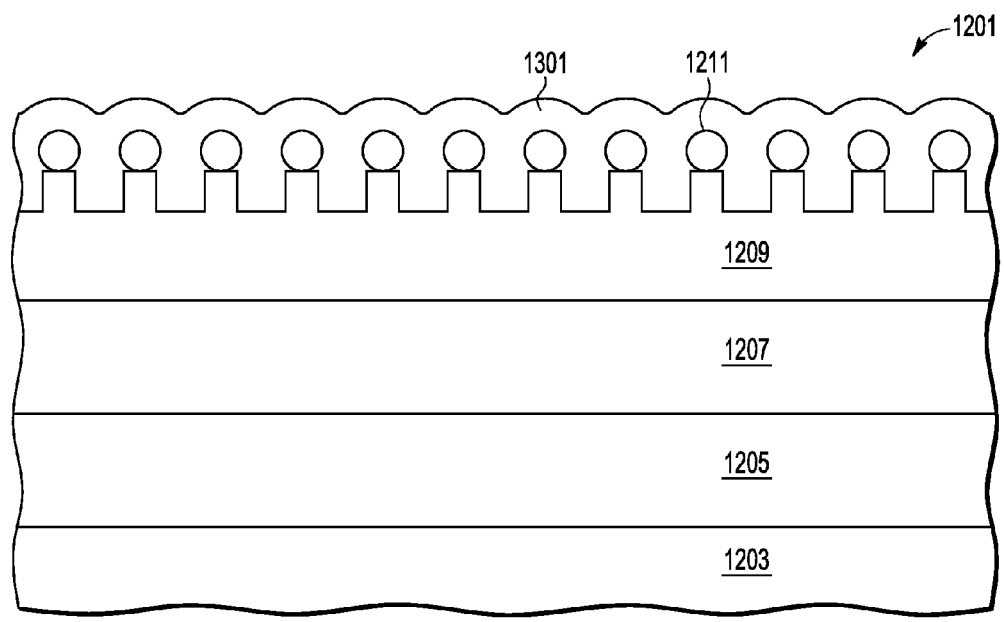

FIG. 13 shows wafer 1201 after a layer of dielectric material 1301 is formed over wafer 1201. In one embodiment, layer 1301 has a thickness such that the lowest point of the top of layer 1301 is higher than the top of nanoclusters 1211. In one embodiment, layer 1301 is made of a dielectric material (e.g. TEOS, $SiO_2$) that is not conducive or relatively less conducive to the formation of filaments at the filament forming voltages applied to the electrodes of a ReRAM cell. One example of such a dielectric is silicon nitride.

Figure 14:
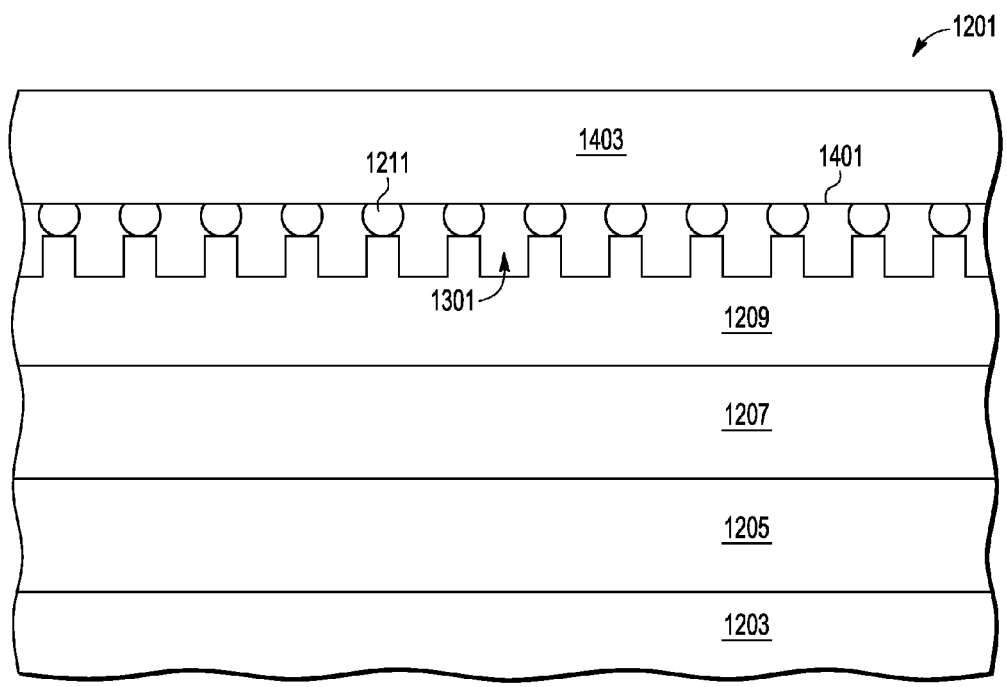

FIG. 14 is a partial cross sectional side view of wafer 1201 after wafer 1201 has been planarized to form planarized surface 1401. In forming planarized surface 1401, wafer 1201 is planarized down to a level such that a significant surface of the nanoclusters 1211 are exposed. Afterwards, conductive layer 1403 is formed over wafer 1201 such that layer 1403 electrically contacts nanoclusters 1211. Layer 1403 is similar to conductive layer 301.

Figure 15:
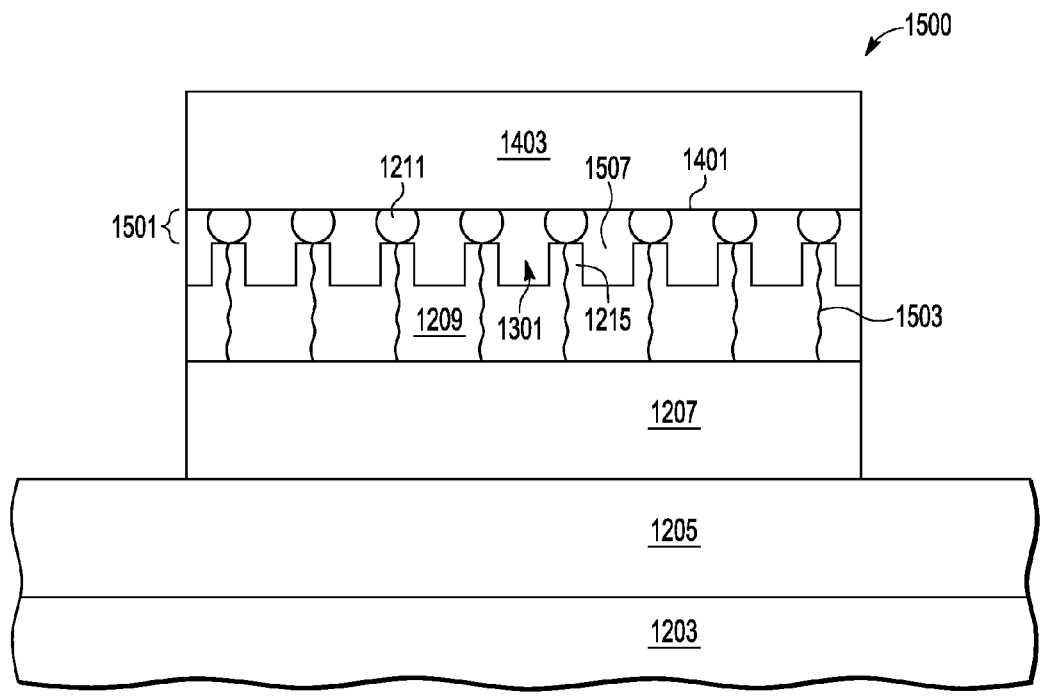

FIG. 15 is a partial side view of wafer 1201 after layers 1403, 1301, 1209 and 1207 are patterned to form ReRAM cells with cell 1500 being shown in FIG. 15. In the embodiment of FIG. 15, nanoclusters 1211 form field focusing features 1507 in region 1501. Features 1507 are isolated from each other by dielectric layer 1301. When a forming voltage is applied between layers 1403 and 1207, an electric field is generated at the interface of pillars 1215 and nanoclusters 1211 to generate filaments 1503. In one embodiment, the use of pillars 1215 enables the depth of the spaces between the pillars to be selected for optimization of filament formation.

Figure 17:
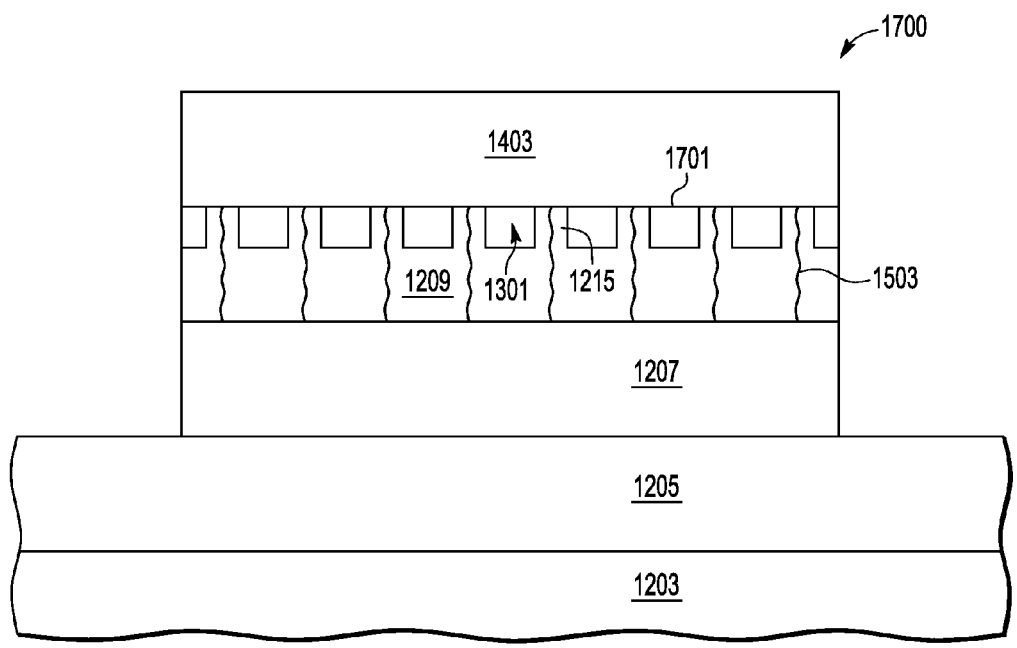
FIG. 17 sets forth a view of forming a portion of a ReRAM memory according to another embodiment of the present invention.

FIG. 17 is a partial side view of a wafer showing a ReRAM cell according to another embodiment of the invention. Cell 1700 is similar to cell 1500 except that nanoclusters 1211 are removed prior to forming layer 1403. In one embodiment, the wafer is planarized after the formation of layer 1301. With this embodiment, nanoclusters 1211 do not have to be conductive. With this embodiment, the field focusing features are the interfaces between the pillars 1215 and the top electrode (of layer 1403) which are located in region 1701.

In other embodiments, a thin conductive layer may be formed on layer 109 before the top electrode layer (e.g. 301) or on layer 107 before the storage material layer 109. This conductive layer may be patterned with nanoclusters formed thereon to form pillars which serve as field focusing features. If formed on the bottom electrode, the storage material layer may be formed on the patterned features. If the conductive pillars are formed below the top electrode layer, a dielectric layer would be formed over the pillars and then planarized to expose the pillars. Afterwards, the top conductive layer 301 would be formed to contact the conductive pillars.

In some embodiments, during filament formation, the higher voltage is applied to the top electrode of the cell. However, in other embodiments, the higher voltage is applied to the bottom electrode. In some embodiments, the lower voltage is ground (0 V), but in other embodiments, the lower voltage may be −VDD (or the negative of the voltage applied to the top electrode).

Certain features described with respect to one embodiment may be combined with other features of other embodiments described herein. For example, field focusing features may be formed for both the bottom electrode and top electrode of a cell. For example, a cell may include both nanoclusters 911 and 709.

The use of nanoclusters for the formation of multiple field focusing features per cell may allow for the formation such multiple features that may be smaller than those that are lithographically defined. Accordingly, more features may be located in a cell as opposed to a cell where such features are lithographically defined.

In one embodiment, a resistive random access memory (ReRAM) cell includes a first conductive electrode and a dielectric storage material layer over the first conductive electrode. The dielectric storage material layer is conducive to the formation of conductive filaments during an application of a filament forming voltage to the ReRAM cell. The ReRAM cell includes a second conductive electrode over the dielectric storage material layer and a layer of conductive nanoclusters including a plurality of nanoclusters in contact with the dielectric storage material layer and in contact with the first conductive electrode or the second conductive electrode.

In another embodiment, a method for forming a resistive random access memory (ReRAM) cell includes forming a first conductive layer and forming a dielectric storage material layer over the first conductive layer. The dielectric storage material layer is conducive to the formation of conductive filaments during an application of a filament forming voltage to the ReRAM cell. The method includes forming a second conductive layer over the dielectric storage material layer and forming a layer of conductive nanoclusters including a plurality of nanoclusters in contact with the dielectric storage material layer and in contact with the first conductive layer or the second conductive layer. The ReRAM cell includes a first plurality of the conductive nanoclusters of the layer of conductive nanoclusters.

In another embodiment, a resistive random access memory (ReRAM) cell includes a first conductive electrode and a dielectric storage material layer over the first conductive electrode. The dielectric storage material layer is conducive to the formation of conductive filaments during an application of a filament forming voltage to the ReRAM cell. The ReRAM cell includes a second conductive electrode over the dielectric storage material layer and an interface region comprising a plurality of interspersed field focusing features for generating electric field for forming filaments in the dielectric storage material layer during an application of a forming voltage to the ReRAM cell. Each field focusing feature includes a conductive nanocluster of a layer of nanoclusters.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A resistive random access memory (ReRAM) cell, comprising:
   a first conductive electrode;
   a dielectric storage material layer over the first conductive electrode, the dielectric storage material layer conducive to the formation of conductive filaments during an application of a filament forming voltage to the ReRAM cell;
   a second conductive electrode over the dielectric storage material layer;
   a layer of conductive nanoclusters including a plurality of nanoclusters, the plurality of nanoclusters of the layer of conductive nanoclusters of the ReRAM cell is in contact with the dielectric storage material layer, the plurality of nanoclusters of the layer of conductive nanoclusters of the ReRAM cell is in contact with the first conductive electrode or the plurality of nanoclusters of the layer of conductive nanoclusters of the ReRAM cell is in contact with the second conductive electrode, the plurality of nanoclusters of the layer of conductive nanoclusters of the ReRAM cell is located between the first conductive electrode and the second conductive electrode.

2. The ReRAM cell of claim 1, wherein the conductive nanoclusters of the layer of conductive nanoclusters are further characterized as field focusing features of the ReRAM cell.

3. The ReRAM cell of claim 1, wherein the dielectric storage material layer comprises a metal oxide.

4. The ReRAM cell of claim 1, wherein the dielectric storage material layer comprises a plurality of openings located between conductive nanoclusters of the layer of conductive nanoclusters, wherein a dielectric material surrounding the conductive nanoclusters of the layer of conductive nanoclusters is located within the plurality of openings.

5. A resistive random access memory (ReRAM) cell, comprising:
a first conductive electrode;
a dielectric storage material layer over the first conductive electrode, the dielectric storage material layer conducive to the formation of conductive filaments during an application of a filament forming voltage to the ReRAM cell;
a second conductive electrode over the dielectric storage material layer;
a layer of conductive nanoclusters including a plurality of nanoclusters in contact with the dielectric storage material layer and in contact with the first conductive electrode or the second conductive electrode;
wherein the dielectric storage material layer comprises a plurality of openings located between conductive nanoclusters of the layer of conductive nanoclusters, wherein a dielectric material surrounding the conductive nanoclusters of the layer of conductive nanoclusters is located within the plurality of openings;
wherein the plurality of openings of the dielectric storage material layer defines a plurality of dielectric storage material columns of the dielectric storage material layer, wherein a conductive nanocluster of the layer of conductive nanoclusters is located on each dielectric storage material column of the plurality of dielectric storage materials columns.

6. The ReRAM cell of claim 1 where the plurality of nanoclusters is in contact with the dielectric storage material layer and the first conductive electrode.

7. The ReRAM cell of claim 1 where the plurality of nanoclusters is in contact with the dielectric storage material layer and the second conductive electrode.

8. The ReRAM cell of claim 1 wherein the plurality of nanoclusters is surrounded by a dielectric material.

9. The ReRAM cell of claim 1 wherein the each nanocluster of the plurality of nanoclusters does not touch an adjacent nanocluster of the plurality of nanoclusters.

10. A resistive random access memory (ReRAM) cell, comprising:
a first conductive electrode;
a dielectric storage material layer over the first conductive electrode, the dielectric storage material layer conducive to the formation of conductive filaments during an application of a filament forming voltage to the ReRAM cell;
a second conductive electrode over the dielectric storage material layer;
an interface region comprising a plurality of interspersed field focusing features for generating electric field for forming filaments in the dielectric storage material layer during an application of a forming voltage to the ReRAM cell, wherein each field focusing feature includes a conductive nanocluster of a layer of nanoclusters, wherein the conductive nanocluster of each field focusing feature of the plurality of interspersed field focusing features of the ReRAM cell is located in the layer of nanoclusters, wherein the layer of nanoclusters is located between the first conductive electrode and the dielectric storage material layer or the layer of nanoclusters is located between the second conductive electrode and the dielectric storage material layer, wherein the conductive nanocluster of each field focusing feature of the plurality of interspersed field focusing features of the ReRAM cell is located between the first conductive electrode and the second conductive electrode.

11. The ReRAM cell of claim 2, wherein the dielectric storage material layer comprises a plurality of openings located between conductive nanoclusters of the layer of conductive nanoclusters, wherein a dielectric material surrounding the conductive nanoclusters of the layer of conductive nanoclusters is located within the plurality of openings.

12. The ReRAM cell of claim 11, wherein the plurality of openings of the dielectric storage material layer defines a plurality of dielectric storage material columns of the dielectric storage material layer, wherein a conductive nanocluster of the layer of conductive nanoclusters is located on each dielectric storage material column of the plurality of dielectric storage materials columns.

13. The ReRAM cell of claim 2 where the plurality of nanoclusters is in contact with the dielectric storage material layer and the first conductive electrode.

14. The ReRAM cell of claim 4 wherein the each nanocluster of the plurality of nanoclusters does not touch an adjacent nanocluster of the plurality of nanoclusters.

15. The ReRAM cell of claim 5 wherein the each nanocluster of the plurality of nanoclusters does not touch an adjacent nanocluster of the plurality of nanoclusters.

16. The ReRAM cell of claim 2 where the plurality of nanoclusters is in contact with the dielectric storage material layer and the second conductive electrode.

17. The ReRAM cell of claim 4 where the plurality of nanoclusters is in contact with the dielectric storage material layer and the second conductive electrode.

18. The ReRAM cell of claim 5 where the plurality of nanoclusters is in contact with the dielectric storage material layer and the second conductive electrode.

19. The ReRAM cell of claim 6 wherein the each nanocluster of the plurality of nanoclusters does not touch an adjacent nanocluster of the plurality of nanoclusters.

20. The ReRAM cell of claim 7 wherein the each nanocluster of the plurality of nanoclusters does not touch an adjacent nanocluster of the plurality of nanoclusters.

* * * * *